United States Patent [19]

Asano et al.

[11] Patent Number: 5,739,187

[45] Date of Patent: Apr. 14, 1998

[54] SEMICONDUCTOR ENCAPSULATING EPOXY RESIN COMPOSITIONS AND SEMICONDUCTOR DEVICES ENCAPSULATED THEREWITH

[75] Inventors: Eiichi Asano; Takayuki Aoki; Toshio Shiobara, all of Usui-gun, Japan; Peter Flury, Himmelried, Switzerland; Wolfgang Scharf, Grenzach-Wyhlen, Germany; Tadashi Okada, Oberwil, Switzerland

[73] Assignees: Shin-Etsu Chemical Co., Ltd., Tokyo, Japan; Ciba-Geigy Corporation, Tarrytown, N.Y.

[21] Appl. No.: 615,145

[22] Filed: Mar. 14, 1996

[30] Foreign Application Priority Data

Apr. 10, 1995 [JP] Japan ............... 7-109059

[51] Int. Cl.⁶ ............... C08G 59/68; C08G 65/10
[52] U.S. Cl. ............... 523/451; 528/89; 528/99; 525/523; 525/538; 523/400; 523/401
[58] Field of Search ............... 523/400, 401, 523/451; 525/523, 538; 528/89, 99

[56] References Cited

U.S. PATENT DOCUMENTS

| | | | |
|---|---|---|---|
| 3,056,806 | 10/1962 | Phillips et al. | 260/348 |
| 4,134,876 | 1/1979 | Horner et al. | 260/45 |
| 4,199,534 | 4/1980 | Fearing | 260/928 |
| 4,820,854 | 4/1989 | Hardy et al. | 558/119 |
| 5,132,346 | 7/1992 | Flury | 524/117 |
| 5,149,730 | 9/1992 | Murata et al. | 525/481 |
| 5,278,212 | 1/1994 | Nishihara et al. | 524/141 |
| 5,506,313 | 4/1996 | Flury et al. | 525/523 |
| 5,567,749 | 10/1996 | Sawamura et al. | 525/482 |
| 5,578,660 | 11/1996 | Fujita et al. | 525/482 |

*Primary Examiner*—Randy Gulakowski
*Attorney, Agent, or Firm*—Millen, White, Zelano & Branigan, P.C.

[57] ABSTRACT

An epoxy resin composition comprising (A) 20–80 parts by weight of an epoxy resin, (B) 20–80 parts by weight of a curing agent, (C) 0.1–50 parts by weight of a phosphorus-containing flame retardant, and (D) 200–1,200 parts by weight of an inorganic filler cures into products having improved high-temperature exposure resistance, flame retardancy, and reflow cracking resistance. The composition eliminates blending of antimony trioxide and brominated compounds and is useful in encapsulating semiconductor devices for imparting high-temperature reliability.

9 Claims, No Drawings

SEMICONDUCTOR ENCAPSULATING EPOXY RESIN COMPOSITIONS AND SEMICONDUCTOR DEVICES ENCAPSULATED THEREWITH

BACKGROUND OF THE INVENTION

1. Field of the Invention

This invention relates to a semiconductor encapsulating epoxy resin composition and more particularly, to a semiconductor encapsulating epoxy resin composition which is free of antimony trioxide and brominated compounds or contains a reduced amount of antimony trioxide and cures to a product having improved high-temperature exposure resistance, flame retardancy and reflow cracking resistance. It also relates to a semiconductor device encapsulated with the composition in cured form.

2. Background Art

With the recent trend toward high density packaging of semiconductor devices, the mainstream of semiconductor device packaging is surface mount packaging. A reliability problem arises in manufacturing such surface mount packages. During manufacture, packages enclosed with conventional encapsulants are exposed to high temperatures of about 215° to 260° C., at which there can occur separation at the chip-encapsulant interface and cracking of the encapsulant portion. Then reliability after packaging is not insured.

Under such circumstances, encapsulants using a biphenyl type epoxy resin characterized by low water absorption and reflow cracking resistance are widely used for the surface mount packaging. Although the biphenyl type epoxy resin has superior reflow cracking resistance to conventional encapsulants owing to low water absorption and low modulus at high temperature, it is inferior to conventional encapsulants in a reliability test to examine high-temperature exposure resistance or the like, leaving a serious problem.

Failure occurs in integrated circuits when they are left to stand at high temperature because an intermetallic compound can form at the joint between an aluminum electrode and a gold wire to increase a resistance value, eventually damaging the wire. It is known that formation of this intermetallic compound is promoted by the presence of $Br^-$ or $Sb^{3+}$ contained in the resin composition as a flame retardant. The most commonly used flame retardant is a combination of brominated epoxy resin and antimony trioxide. Therefore, reducing the amount of the flame retardant blended would be effective for improving high-temperature exposure resistance.

Undesirably, reducing the amount of the flame retardant blended improves high-temperature exposure resistance to some extent at the sacrifice of flame retardancy, that is, failing to meet the flame retardancy standard, UL-94, V-0 rating.

Antimony trioxide ($Sb_2O_3$) and brominated compounds used as the flame retardant are toxic materials. From the standpoint of its influence to human bodies and the environment, it is desirable that the resin composition does not contain antimony trioxide and brominated compounds or contains a minimized amount of antimony trioxide.

SUMMARY OF THE INVENTION

An object of the present invention is to provide a semiconductor encapsulating epoxy resin composition which can eliminate or reduce the amount of antimony trioxide and brominated compounds used and cures to a product having improved high-temperature exposure resistance, flame retardancy and fellow cracking resistance. Another object of the present invention is to provide a semiconductor device encapsulated with a cured product of such a semiconductor encapsulating epoxy resin composition.

The inventors have found that a semiconductor encapsulating epoxy resin composition using a compound of formula (1) to be defined below as a flame retardant cures to a product which is improved in flame retardancy despite the absence of antimony trioxide and brominated compounds. The cured product is also improved in reflow cracking resistance and high-temperature exposure resistance. Then a semiconductor device encapsulated with the cured product is improved in high-temperature reliability. The present invention is predicated on this finding.

Formula (1):

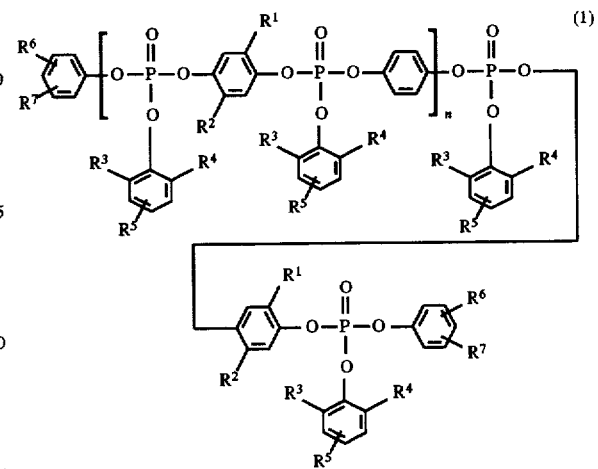

In the formula, each of $R^1$ and $R^2$ is an alkyl radical having 1 to 4 carbon atoms. Each of $R^3$ and $R^4$ is a hydrogen atom or alkyl radical having 1 to 4 carbon atoms. $R^5$ is a hydrogen atom, hydroxyl radical or glycidoxy radical. Each of $R^6$ and $R^7$ is a hydrogen atom, hydroxyl radical, or a radical represented by

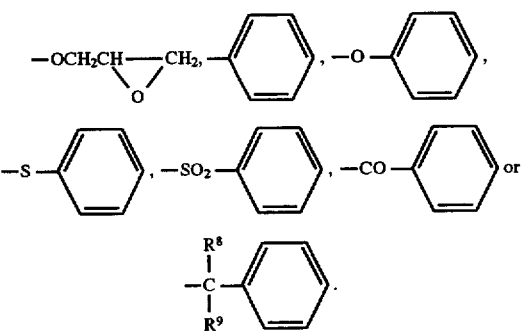

Each of $R^8$ and $R^9$ is a hydrogen atom or methyl radical. Letter n is an integer of 0 to 10.

Briefly stated, the present invention provides a semiconductor encapsulating epoxy resin composition comprising (A) 20 to 80 parts by weight of an epoxy resin, (B) 20 to 80 parts by weight of a curing agent, (C) 0.1 to 50 parts by weight of a compound of formula (1), and (D) 200 to 1,200 parts by weight of an inorganic filler.

A semiconductor device encapsulated with a cured product of the composition is also contemplated herein.

The epoxy resin composition of the invention uses a phosphorus compound of a specific structure as defined by formula (1) as a substitute for brominated epoxy resin and antimony trioxide traditionally used as the flame retardant. Since the composition does not contain any source of $Br^-$ and $Sb^{3+}$ capable of promoting formation of an intermetallic compound during high-temperature exposure, semiconductor devices encapsulated with cured products of the composition exhibit high-temperature reliability comparable to flame retardant-free epoxy resin compositions. The inventive composition also has superior flame retardancy and reflow cracking resistance. In addition, since antimony trioxide and brominated compounds which are detrimental to human bodies and pollutes the environment is omitted, the present invention offers an epoxy resin composition which is quite useful in the industry.

DETAILED DESCRIPTION OF THE INVENTION

A first essential component or component (A) of the semiconductor encapsulating epoxy resin composition according to the present invention is an epoxy resin. Included are biphenyl type epoxy resins, novolak type epoxy resins, polyfunctional epoxy resins, alicyclic epoxy resins, heterocyclic epoxy resins, bisphenol A epoxy resins, naphthalene ring-containing epoxy resins, and halogenated epoxy resins. Preferred among others are biphenyl type epoxy resins since they most effectively satisfy the requirement of reflow cracking resistance. Another epoxy resin or resins may be used in combination with the biphenyl type epoxy resin, if necessary.

The biphenyl type epoxy resin is typically represented by the following general formula (6).

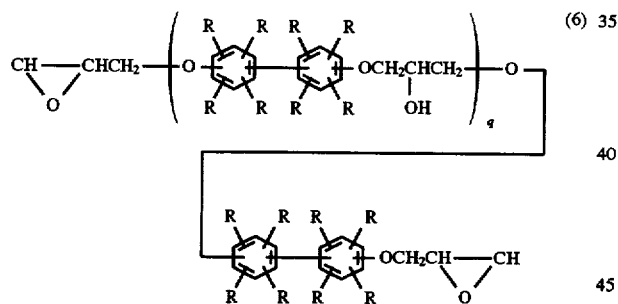

In the formula, R is a hydrogen atom, halogen atom or alkyl radical having 1 to 5 carbon atoms, and letter q is an integer of 0 to 5.

Any desired curing agent (B) may be used for the epoxy resin insofar as it is a compound having at least two functional groups capable of reacting with the epoxy resin. The curing agent is not particularly limited in molecular structure and molecular weight. Exemplary curing agents are phenol resins including bisphenol A and F type phenol resins, phenol novolak resins, triphenol alkane type phenol resins and polymers thereof, biphenyl type phenol resins, dicyclopentadiene-phenol novolak resins, phenol aralkyl type phenol resins, naphthalene ring-containing phenol resins, alicyclic phenol resins, and heterocyclic phenol resins. Amines and acid anhydrides are also useful curing agents. They may be used alone or in admixture.

The epoxy resin (A) and curing agent (B) are used in such proportion that there are 20 to 80 parts by weight of the epoxy resin (A) and 80 to 20 parts by weight of the curing agent (B), provided that the sum of (A)+(B) is 100 parts by weight. Particularly when a phenol resin is used as the curing agent, it is preferably blended in such amounts that the molar ratio of epoxy groups in the epoxy resin to phenolic hydroxyl groups in the phenol resin may range from ½ to ⅔, more preferably from ½ to ⅗, most preferably from ⅘ to ⅗.

In the practice of the invention, a curing catalyst is preferably used in order to promote curing reaction between the epoxy resin and the curing agent. Any desired curing catalyst may be used insofar as it can promote curing reaction. Exemplary curing catalysts include phosphorus compounds such as triphenylphosphine, tributylphosphine, tri(p-methylphenyl)phosphine, tri(p-methoxyphenyl)phosphine, tri(p-ethoxyphenyl)phosphine, triphenylphosphine triphenyl borate, and tetraphenylphosphine tetraphenyl borate; tertiary amines such as triethylamine, benzyldimethylamine, α-methylbenzyldimethylamine, and 1,8-diazabicyclo(5.4.0)-undecene-7; and imidazoles such as 2-methylimidazole, 2-phenylimidazole, and 2-phenyl-4-methylimidazole.

The curing catalyst is preferably blended in an amount of 0.01 to 20 parts by weight, especially 0.1 to 10 parts by weight per 100 parts by weight of the epoxy resin and curing agent combined.

The composition of the present invention is characterized by using a compound of formula (1) as a flame retardant.

Formula (1):

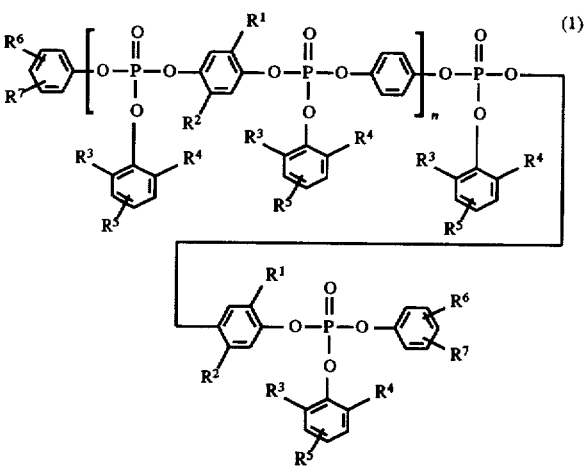

In the formula, each of $R^1$ and $R^2$ is an alkyl radical having 1 to 4 carbon atoms. Each of $R^3$ and $R^4$ is a hydrogen atom or alkyl radical having 1 to 4 carbon atoms. $R^5$ is a hydrogen atom, hydroxyl radical or glycidoxy

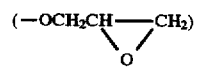

radical. Each of $R^6$ and $R^7$ is a hydrogen atom, hydroxyl radical, or a radical represented by

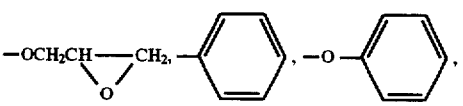

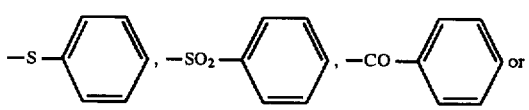

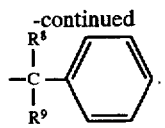

Each of $R^8$ and $R^9$ is a hydrogen atom or methyl radical. Letter n is an integer of 0 to 10.

The alkyl radicals having 1 to 4 carbon atoms include methyl, ethyl, n-propyl, i-propyl, n-butyl, sec-butyl, and tert-butyl radicals. While $R^1$ to $R^7$ are as defined above, both $R^1$ and $R^2$ are preferably the same alkyl radicals, most preferably tert-butyl radicals. Both $R^3$ and $R^4$ are preferably methyl radicals. $R^5$ is preferably a hydrogen atom. At least one of $R^6$ and $R^7$ is preferably a hydroxyl radical or glycidyl ether radical because these compounds may react with the epoxy resin component to form a part of the resin skeleton.

Preferred among the compounds of formula (1) are compounds of the following formulae (2) and (3).

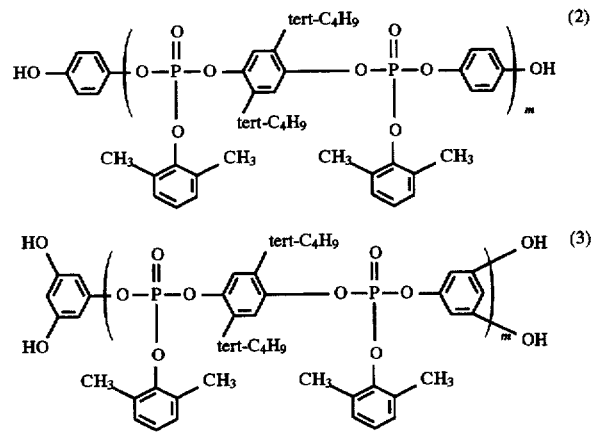

In these formulae, letter m is an integer of 1 to 11.

It is noted that the compounds of formula (1) should desirably contain less than 50 ppm, more desirably less than 10 ppm of chloride ions and alkali metal ions combined as extracted at 120° C. and RH 100%. More than 50 ppm of chloride ions and alkali metal ions combined would adversely affect the high-temperature exposure resistance and humidity resistance of the composition.

The flame retardant of formula (1) is added to the composition in an amount of 0.1 to 50 parts by weight per 100 parts by weight of the epoxy resin and curing agent (typically phenol resin) combined. Flame retardancy is insufficient with less than 0.1 part of the flame retardant whereas more than 50 parts of the flame retardant would increase the viscosity of the composition during molding, adversely affecting molding.

In the practice of the invention, a phosphorus-containing compound of the following formula (4) or (5) is preferably blended as a flame retardant aid along with the compound of formula (1). The combined use of the compound of formula (1) and the compound of formula (4) or (5) makes it easier to satisfy the flame retardancy standard (UL-94, V-0 rating) than the use of the compound of formula (1) alone.

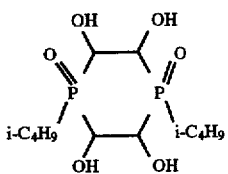

(CYAGARD RF 1204, Citex-Ind.)

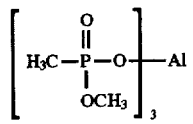

(REOFLAM 410, FMC-Ind.)

The amount of the flame retardant aid of formula (4) or (5) added is preferably 0.1 to 50 parts by weight per 100 parts by weight of the epoxy resin and curing agent (typically phenol resin) combined. Less than 0.1 part of the aid would be ineffective for its purpose whereas more than 50 parts of the aid would increase the viscosity of the composition to obstruct molding. The mixing proportion of the compound of formula (4) or (5) and the compound of formula (1) is preferably from 0.2:1 to 2:1.

The epoxy resin composition of the invention further contains (D) an inorganic filler which is selected from those commonly used in conventional epoxy resin compositions. Exemplary fillers include silica fillers such as fused silica and crystalline silica, alumina, silicon nitride, aluminum nitride, boron nitride, titanium oxide, and glass fibers. The inorganic filler is not particularly limited in mean particle size or shape although fillers with a mean particle size of about 5 to 40 µm are preferred for moldability and fluidity. The loading of the inorganic filler is 200 to 1,200 parts by weight per 100 parts by weight of the epoxy resin and curing agent (typically phenol resin) combined. Compositions containing less than 200 parts of the filler have a larger coefficient of expansion so that more stresses are applied to semiconductor devices to detract from their properties and with respect to high-temperature exposure resistance, intermetallic compounds formed by high-temperature exposure receive more stresses, resulting in losses of properties. Compositions containing more than 1,200 parts of the filler have a higher viscosity to adversely affect molding. It is recommended to use the inorganic fillers which have been surface treated with silane coupling agents in order to enhance the bond strength between the resin and the filler surface.

If desired, the epoxy resin composition of the invention may further contain various additives. Exemplary additives are stress-releasing agents such as thermoplastic resins, thermoplastic elastomers, organic synthetic rubbers and silicone, waxes such as carnauba wax, fatty acids and metal salts such as stearic acid, pigments such as carbon black, cobalt blue, and red iron oxide, silane coupling agents such as glycidoxypropyltrimethoxysilane, surface treating agents such as alkyl titanates, anti-oxidants, and halogen trapping agents.

The epoxy resin composition of the invention is prepared, for example, by uniformly agitating and blending predetermined amounts of the above-mentioned essential and optional components, and kneading the mixture by a kneader, hot roll mill or extruder pre-heated at 70° to 95° C., cooling and comminuting into chips.

The epoxy resin composition thus obtained is useful in encapsulating various semiconductor devices therewith. The composition may be molded over semiconductor devices by any conventional technique such as transfer molding, injection molding, and casting. Low pressure transfer molding is effective for the epoxy resin composition of the invention. Desirably the epoxy resin composition is molded at a temperature of 150° to 180°C. for 30 to 180 seconds and post cured at a temperature of 150° to 180° C. for 2 to 16 hours.

There has been described an epoxy resin composition which can eliminate the use of antimony trioxide or reduce the amount of antimony trioxide and brominated compounds used and which cures to a product having improved high-temperature exposure resistance, flame retardancy and reflow cracking resistance. A semiconductor device encapsulated with a cured product of such a semiconductor encapsulating epoxy resin composition remains reliable at high temperature.

EXAMPLE

Examples of the invention are given below by way of illustration and not by way of limitation. All parts are by weight.

EXAMPLES 1–6 AND COMPARATIVE EXAMPLES 1–3

Epoxy resin compositions were prepared by uniformly melt mixing the components shown in Table 1 in a hot twin roll mill, followed by cooling and comminution.

(2) Gelling Time

The gelling time of a composition was measured on a hot plate at 175° C.

(3) Molded Hardness

A rod of 10×4×100 mm was molded at 175° C. and 70 kg/cm$^2$ for 120 seconds according to JIS K-6911. The rod was measured for hardness by a Barcol hardness tester while being hot.

(4) Reflow Cracking

A flat package of 14×20×2.1 mm was molded at 175° C. and 70 kg/cm$^2$ for 120 seconds and post cured at 180° C. for 4 hours. It was allowed to stand in a constant temperature/humidity container at 85° C. and RH 85% for 75 hours for water absorption and then dipped in a solder bath at 240° C. for 30 seconds. The package surface was observed for cracks.

(5) Flame Retardancy

According to UL-94 standard, a plate of 1/16 inch thick was molded and examined for flame retardancy.

(6) High-Temperature Exposure Resistance

A simulating element having aluminum wiring on a silicon chip and a partially gold-plated 42-alloy lead frame were bonded with a gold wire of 30 μm diameter. The assembly was encapsulated with an epoxy resin composition by molding at 175° C. and 70 kg/cm$^2$ for 120 seconds,

TABLE 1

| Component | Example | | | | | | Comparative Example | | |
|---|---|---|---|---|---|---|---|---|---|
| | 1 | 2 | 3 | 4 | 5 | 6 | 1 | 2 | 3 |
| Novolak type epoxy resin*[1] | 63 | 63 | 63 | 63 | — | — | 56 | — | — |
| Biphenyl type epoxy resin*[2] | — | — | — | — | 63 | 63 | — | 56 | 63 |
| Curing agent*[3] | 37 | 37 | 37 | 37 | 37 | 37 | 35.4 | 35.4 | 37 |
| Compound of formula (2) | 20 | — | 8 | 8 | 8 | 8 | — | — | — |
| Compound of formula (3) | — | 20 | — | — | — | — | — | — | — |
| Compound of formula (4) | — | — | 4 | — | 4 | — | — | — | — |
| Compound of formula (5) | — | — | — | 4 | — | 4 | — | — | — |
| Brominated epoxy resin*[4] | — | — | — | — | — | — | 8.6 | 8.6 | — |
| Antimony trioxide | — | — | — | — | — | — | 10 | 10 | — |
| Fused silica | 550 | 550 | 550 | 550 | 550 | 550 | 550 | 550 | 550 |
| Carbon black | 2.0 | 2.0 | 2.0 | 2.0 | 2.0 | 2.0 | 2.0 | 2.0 | 2.0 |
| Silane coupling agent*[5] | 2.0 | 2.0 | 2.0 | 2.0 | 2.0 | 2.0 | 2.0 | 2.0 | 2.0 |
| Carnauba wax | 1.5 | 1.5 | 1.5 | 1.5 | 1.5 | 1.5 | 1.5 | 1.5 | 1.5 |
| Triphenylphosphine | 1.0 | 1.0 | 1.0 | 1.0 | 1.0 | 1.0 | 1.0 | 1.0 | 1.0 |

*[1] manufactured by Nihon Kayaku K.K., EOCN-4400, epoxy equivalent 190
*[2] manufactured by Yuka Shell Epoxy K.K., YX-4000HK, epoxy equivalent 190
*[3] Meiwa Kasei K.K., DL-92 phenol-novolak resin, phenol equivalent 110
*[4] manufactured by Nihon Kayaku K.K., BREN-105, epoxy equivalent 280, bromine content 35%
*[5] manufactured by Shin-Etsu Chemical Co., Ltd., KBM-403

These compositions were examined by the following tests. The results are shown in Table 2.

(1) Spiral Flow

Using a mold as prescribed by the EMMI standard, spiral flow was measured under conditions: 175° C., 70 kg/cm$^2$ and a molding time of 120 seconds.

obtaining a 14 pin DIP. The package was post cured at 180° C. for 4 hours and allowed to stand in a drier at 200° C. for a preselected time (0, 96 and 168 hours). After the cured resin was dissolved away in fuming nitric acid, the bonded portions on the chip side were measured for shear strength.

TABLE 2

| Property | Example | | | | | | Comparative Example | | |
|---|---|---|---|---|---|---|---|---|---|
| | 1 | 2 | 3 | 4 | 5 | 6 | 1 | 2 | 3 |
| Spiral flow (cm) | 78 | 75 | 90 | 85 | 110 | 103 | 80 | 99 | 125 |
| Gelling time (sec.) | 20 | 20 | 20 | 20 | 23 | 23 | 20 | 22 | 23 |
| Molded hardness | 80 | 79 | 80 | 81 | 76 | 77 | 80 | 78 | 79 |

TABLE 2-continued

| Property | Example | | | | | | Comparative Example | | |
|---|---|---|---|---|---|---|---|---|---|
| | 1 | 2 | 3 | 4 | 5 | 6 | 1 | 2 | 3 |
| Reflow cracking | 2/6 | 2/6 | 2/6 | 2/6 | 0/6 | 0/6 | 6/6 | 3/6 | 3/6 |
| UL-94 | V-0 | V-0 | V-0 | V-0 | V-0 | V-0 | V-0 | V-0 | burned |
| Shear strength (g) | | | | | | | | | |
| 200° C. × 0 hr. | 80 | 80 | 80 | 80 | 80 | 80 | 80 | 80 | 80 |
| 200° C. × 96 hr. | 77 | 77 | 77 | 78 | 73 | 71 | 45 | 35 | 75 |
| 200° C. × 168 hr. | 76 | 76 | 75 | 75 | 68 | 63 | 35 | 31 | 63 |

As seen from the results of Table 2, the epoxy resin compositions containing a phosphorus-containing flame retardant within the scope of the invention yield cured products having improved high-temperature exposure resistance, flame retardancy, and reflow cracking resistance.

Reference Example 1: Synthesis of Compound of Formula (2)

In a reactor equipped with a condenser and exhaust gas removing unit, 3.78 kg (17 mol) of 2,5-di-tert-butylhydroquinone, 3 kg of ethyl acetate, and 0.170 kg of pyridine were thoroughly mixed by agitation under dry nitrogen. After the reactor was heated to an internal temperature of 60° C., 4.67 kg (34 mol) of phosphorus trichloride at 60° C. was added to the mixture over 30 minutes. The resulting mixture was refluxed for about one hour at an internal temperature of about 74° C. Then a solution of 4.15 kg (34 mol) of 2,6-dimethylphenol in 3 kg of ethyl acetate was added to the mixture over one hour at an internal temperature of 75° to 77° C. The resulting brown solution was agitated under reflux for 1-½ hours and then cooled to about 25° C. A solution of 3.74 kg (34 mol) of hydroquinone in 9 kg of ethyl acetate and 2.7 kg of acetone at 25° C. was added dropwise to the reaction solution over about two minutes. 4.66 kg (46 mol) of triethylamine was added thereto, and the resulting mixture was agitated for a further 30 minutes. To the mixture 3.86 kg of 30% $H_2O_2$ was added over about one hour. The mixture was agitated for a further 2 hours while maintaining the reactor at a temperature of 30° to 35° C. The resulting mixture was washed twice with 1N HCl and once with 0.1N HCl. The organic phase was separated, dried over sodium sulfate, and stripped of the solvent under vacuum. Finally, the solid residue was dried for a further 30 minutes under high vacuum, yielding 8.33 kg (theoretical yield 71%) of the end product. On GPC analysis, it had Mn=700 and Mw=2947. The results of elemental analysis are shown below. The chlorine content was less than 0.3%.

| | C | H | P |
|---|---|---|---|
| Found, % | 64.35 | 6.28 | 8.22 |
| Calcd., % | 65.28 | 6.00 | 8.02 |

Reference Example 2: Synthesis of Compound of Formula (3)

In a reactor equipped with a condenser and exhaust gas removing unit, 22.22 g (0.1 mol) of 2,5-di-tert-butylhydroquinone, 17.5 g of ethyl acetate, and 1.05 g of pyridine were thoroughly mixed by agitation under dry argon. To the mixture was added 27.5 g (0.2 mol) of phosphorus trichloride. The resulting mixture was slowly heated and maintained under reflux for about one hour. Then a solution of 24.4 g (0.2 mol) of 2,6-dimethylphenol in 17.5 g of ethyl acetate was added to the mixture over about 10 minutes. The resulting brown solution was agitated under reflux for 1-½ hours and then cooled to about 25° C. A solution of 25.22 g (0.2 mol) of 1,3,5-trihydroxybenzene in 52 g of ethyl acetate and 15.5 g of acetone under ice cooling was added dropwise to the reaction solution over about 15 minutes, 27.35 g (0.27 mol) of triethylamine was added thereto over 30 minutes under ice cooling, and the resulting mixture was agitated for a further 30 minutes. To the mixture 2.67 g of 30% $H_2O_2$ was slowly added. The mixture was agitated for a further 2 hours. Thereafter, as in Reference Example 1, the end compound was isolated and dried.

The resulting brown resinous material had a softening point of 156.6° to 171.2° C. The results of elemental analysis are shown below. The hydroxyl content was 5.65 meq/g.

| | C | H | P |
|---|---|---|---|
| Found, % | 61.20 | 6.53 | 8.13 |
| Calcd., % | 62.53 | 6.00 | 7.68 |

Although some preferred embodiments have been described, many modifications and variations may be made thereto in the light of the above teachings. It is therefore to be understood that within the scope of the appended claims, the invention may be practiced otherwise than as specifically described.

We claim:

1. A semiconductor encapsulating epoxy resin composition suitable for molding over a semiconductor comprising (A) 20 to 80 parts by weight of an epoxy resin which is a biphenyl epoxy resin or novolak epoxy resin, (B) 20 to 80 parts by weight of a curing agent, (C) 0.1 to 50 parts by weight of a compound of the general formula (1), and (D) 200 to 1,200 parts by weight of an inorganic filler, the general formula (1) being:

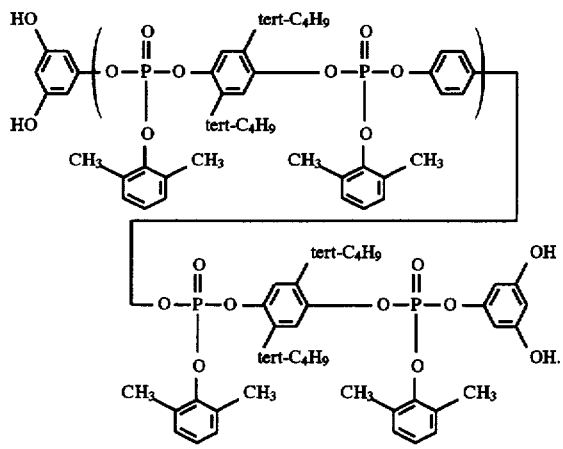

wherein each of $R^1$ and $R^2$ is an alkyl radical having 1 to 4 carbon atoms, each of $R^3$ and $R^4$ is a hydrogen atom or alkyl radical having 1 to 4 carbon atoms, $R^5$ is a hydrogen atom, hydroxyl radical or

—OCH₂CH—CH₂
        \ /
         O radical, $R^6$ and $R^7$ are independently selected from the group consisting of a hydrogen atom, hydroxyl radical, and radicals represented by

—OCH₂CH—CH₂, —⌬—, —O—⌬,

—S—⌬, —SO₂—⌬, —CO—⌬ and $R^8$
        |
       —C—⌬.
        |
       $R^9$ each of $R^8$ and $R^9$ is a hydrogen atom or methyl radical, and letter n is an integer of 0 to 10.

2. The composition of claim 1 wherein the compound of formula (1) is a compound of the following formula (2):

(2)

wherein letter m is an integer of 1 to 11.

3. The composition of claim 1 further comprising (E) a flame retardant aid in the form of a phosphorus-containing compound of the following formula (4) or (5):

(4)

(5)

4. The composition of claim 1 wherein epoxy resin (A) is a biphenyl epoxy resin.

5. The composition of claim 4, wherein the epoxy resin (A) has the formula (6)

wherein R is a hydrogen atom or alkyl radical having 1 to 5 carbon atoms, and letter q is an integer of 0 to 5.

6. A semiconductor device encapsulated with a cured product of a semiconductor encapsulating epoxy resin composition as set forth in claim 1.

7. The composition of claim 1, wherein the compound of formula (1) is a compound of the formula:

8. The composition of claim 1, which is substantially free of antimony trioxide and brominated compounds.

9. The composition of claim 1, wherein n is 1–10.

* * * * *